United States Patent [19]

Nishimura et al.

[11] Patent Number: 5,188,992

[45] Date of Patent: Feb. 23, 1993

[54] PIEZOELECTRIC CERAMIC COMPOSITION FOR ACTUATORS

[75] Inventors: Tetsuhiko Nishimura, Zama; Takahiro Choda, Yokohama; Yukio Chida; Yasuo Oguri, both of Tokyo, all of Japan

[73] Assignee: Mitsubishi Kasei Corporation, Tokyo, Japan

[21] Appl. No.: 762,361

[22] Filed: Sep. 19, 1991

[30] Foreign Application Priority Data

Sep. 20, 1990 [JP] Japan .................. 2-250700

[51] Int. Cl.$^5$ .................. C04B 35/46; C04B 35/49
[52] U.S. Cl. .................. 501/136; 252/62.9
[58] Field of Search .................. 501/136, 134, 135; 252/62.9 PZT

[56] References Cited

U.S. PATENT DOCUMENTS

| | | | |
|---|---|---|---|
| 4,210,546 | 7/1980 | Ouchi et al. | 252/62.9 PZT |
| 4,542,107 | 9/1985 | Kato et al. | 501/135 |
| 4,711,862 | 12/1987 | Yokotani et al. | 501/136 |
| 4,721,692 | 1/1988 | Nishioka et al. | 501/136 |
| 4,755,493 | 7/1988 | Takeuchi et al. | 501/134 |
| 4,765,919 | 8/1988 | Tomita et al. | 501/134 |
| 4,882,078 | 11/1989 | Nishimura et al. | 501/136 |
| 4,882,652 | 11/1989 | Furukawa et al. | 501/135 |

FOREIGN PATENT DOCUMENTS

| | | |
|---|---|---|
| 0012583 | 6/1980 | European Pat. Off. |
| 0319006 | 6/1989 | European Pat. Off. |
| 0444204 | 4/1991 | European Pat. Off. |

OTHER PUBLICATIONS

Journal of Materials Science, vol. 22, No. 6, Jun. 1987, London, G.B., pp. 2209-2215, P. Roy-Chowdhury, et al., "Effect of Dopants on the Microstructure and Lattice Parameters of Lead Zirconate-Titanate Ceramics".

*Primary Examiner*—Mark L. Bell
*Assistant Examiner*—Deborah Jones
*Attorney, Agent, or Firm*—Oblon, Spivak, McClelland, Maier & Neustadt

[57] ABSTRACT

A piezoelectric ceramic composition for actuators, composed of lead, lanthanum, zirconium, titanium, magnesium, zinc, niobium, manganese, chromium and oxygen atoms, which contains manganese in an amount of at most 1.5% by weight as calculated as $Mn_2O$ and chromium in an amount of at most 0.5% by weight as calculated as $Cr_2O_3$, relative to a main component composition of the formula (I):

$$Pb_{(1-x)}La_x[(1-z)(Zr_yTi_{(1-y)})+z\{Mg_qZn_{(1-q)})_{\frac{1}{3}}Nb_{\frac{2}{3}}\}]_{(1-x/4)}O_3 \quad (I)$$

wherein $0 < x \leq 0.07$, $0.40 \leq y \leq 0.65$, $0 \leq q \leq 1$, and $0 < z \leq 0.40$.

9 Claims, No Drawings

PIEZOELECTRIC CERAMIC COMPOSITION FOR ACTUATORS

The present invention relates to a piezoelectric ceramic composition for actuators. More particularly, it relates to a piezoelectric ceramic composition for actuators, which is useful as a material for piezoelectric actuators particularly suitable for operation at a high frequency of a level of a few kHz to 100 kHz, among a wide range of applications of piezoelectric actuators, as will be described hereinafter.

Actuators are designed to employ a piezoelectric reverse effect, i.e. an action to convert an electrical energy to a mechanical energy, to perform a fine displacement of a micron or submicron order by application of a voltage. They have been developed rapidly in recent years for application to e.g. precise control of a sound for e.g. a buzzer, or of a flow rate for e.g. a pumpor a valve, precise positioning for e.g. a stepper or an apparatus for the production of semiconductors, and an ultrasonic motor which has attracted an attention as a small size motor of next generation.

Heretofore, as a piezoelectric material for actuators, a lead zirconate titanate ceramic composition PZT) has been known as having excellent piezoelectric characteristics, and various improvements have been made thereon depending upon its particular applications.

For example, improvements of the characteristics of the PZT type piezoelectric material for actuators have been made by e.g. a method of substituting a part of the lead zirconate titanate by e.g. $Ba^{2+}$, $Sr^{2+}$ or $Ca^{2+}$, a method of preparing a solid solution with a composite perovskite such as $Pb(CO_{\frac{1}{3}}, Ta_{\frac{2}{3}})O_3$ or $Pb(Ni_{\frac{1}{3}}, Nb_{\frac{2}{3}})O_3$, or a method of adding an oxide such as $WO_3$, $Fe_2O_3$ or NiO.

When a piezoelectric actuator device is operated at a resonant frequency of a level of a few kHz to 100 kHz as in the case of an ultrasonic motor developed in recent years, the piezoelectric material is required to have a high mechanical quality coefficient (for example, $Qm \geq 1,000$) to have a large vibrational amplitude in a resonance state and to control heat generation.

However, when conventional high piezoelectric strain constant material (so-called soft material) for actuators is employed, the mechanical quality coefficient (Qm) is low at a level of a few tens to hundred, and a loss at the resonance point is vigorous, whereby the input energy can not effectively be converted to a mechanical energy, and consequently there have been problems such that the displacement tends to be small and heat generation tends to be vigorous. Further, the soft high piezoelectric strain constant material usually has a low Curie's temperature (Tc) at a level of from 100° to 150° C., and the heat generation tends to reach the Curie's point, whereby there will be a problem that depolarization takes place, or no displacement takes place.

Also, in a case where a piezoelectric actuator device is operated at a high frequency of a level of a few kHz to a few tens kHz in a non-resonance state, the above-mentioned soft material has a large dielectric constant ($\epsilon_{33}T/\epsilon_0$) and a large dielectric loss (tan $\delta$) (for example, $\epsilon_{33}T/\epsilon_0 \approx 5,000$, and tan $\delta \geq 2$ to 4%), whereby heat generation is vigorous, depolarization takes place for the above-mentioned reason, and the desired displacement tends to be hardly obtainable.

On the other hand, a so-called hard material having a high Curie's temperature (for example, Tc > 300° C.) is employed, the dielectric constant ($\epsilon_{33}T/\epsilon_0$) and the dielectric loss (tan $\delta$) become small, (for example $\epsilon_{33}T/\epsilon_0 \approx 500$ to 1,000, and tan $\delta \approx 0.1$ to 1%), but the piezoelectric strain constant decreases substantially, for example, the lateral piezoelectric strain constant ($d_{31}$) decreases to a level of $50 \times 10^{-12}$ m/v, whereby in order to obtain a desired displacement, a high voltage will be required, and an expensive amplifier is required for operation at a high voltage and high frequency.

As described in the foregoing, when a piezoelectric actuator is operated at a high frequency of a level of a few kHz to hundred kHz, it is desired to develop a material having excellent characteristics such that the piezoelectric strain constant is large, for example, the lateral mode piezoelectric strain constant ($d_{31}$) is at least $100 \times 10^{-12}$ m/v, the dielectric constant ($\epsilon_{33}T/\epsilon_0$) and the dielectric loss (tan $\delta$) are small, for example, $\epsilon_{33}T/\epsilon_0 \approx 1,000$ to 3,000, and tan $\delta$0.1 to 1%, and the mechanical quality coefficient (Qm) is high, for example, Qm is at least 1,000.

The present invention has been accomplished under these circumstances. It is an object of the present invention to provide a piezoelectric ceramic composition for actuators, which is very useful as a piezoelectric actuator material suitable for operation at a high frequency of a level of a few kHz to hundred kHz and which has a high piezoelectric strain constant, a low dielectric constant, a low dielectric loss and a high mechanical quality coefficient.

Thus, the present invention provides a piezoelectric ceramic composition for actuators, composed of lead, lanthanum, zirconium, titanium, magnesium, zinc, niobium, manganese, chromium and oxygen atoms, which contains manganese in an amount of at most 1.5% by weight as calculated as $MnO_2$ and chromium in an amount of at most 0.5% by weight as calculated as $Cr_2O_3$, relative to a main component composition of the formula (I):

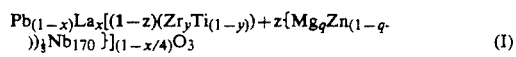

$$Pb_{(1-x)}La_x[(1-z)(Zr_yTi_{(1-y)})+z\{Mg_qZn_{(1-q-)})\}_{\frac{1}{3}}Nb_{17O}\}]_{(1-x/4)}O_3 \quad (I)$$

wherein $0 < x \leq 0.07$, $0.40 \leq y \leq 0.65$, $0 \leq q \leq 1$, and $0 < z \leq 0.40$.

Namely, the present inventors have conducted detailed studies to accomplish the above object and as a result, have found that a composition having a specific composition has a high piezoelectric constant, a low dielectric constant, a low dielectric loss and a high mechanical quality coefficient at the same time. The present invention has been accomplished on the basis of this discovery.

Now, the present invention will be described in detail with reference to the preferred embodiments.

In the following description, the amount of manganese as calculated as $MnO_2$ and the amount of chromium as calculated as $Cr_2O_3$, relative to the main component composition of the formula (I) will be referred to simply as "the amount of $MnO_2$" and "the amount of $Cr_2O_3$", respectively.

The piezoelectric ceramic composition for actuators of the present invention has a high Curie's temperature, a high piezoelectric strain constant and a high mechanical quality coefficient.

With the composition of the present invention, the larger the amount of $MnO_2$, the larger the mechanical quality coefficient (Qm), provided that the rest of the composition is constant. The composition of the present invention can be classified into two groups with the amount of $MnO_2$ of 0.3% by weight being the border line.

Namely, in a case where the amount of $MnO_2$ is at least 0.3% by weight, preferably from 0.4 to 1.2% by weight, the composition of the present invention exhibits a very large mechanical quality coefficient (Qm), and a loss at the resonance point is small. Accordingly, such a composition is suitable as a material for operation at a high frequency utilizing resonance.

On the other hand, in a case where the amount of $MnO_2$ is less than 0.3% by weight, preferably from 0.05 to 0.25% by weight, it is possible to obtain a ceramic composition having a large lateral mode piezoelectric strain constant ($d_{31}$) and a very small dielectric loss (tan δ) although the mechanical quality coefficient (Qm) is not so large. Such a composition is suitable as a material for operation at a high frequency to be used in a non-resonance state.

Further, in the composition of the present invention, the content of lanthanum is influential over the Curie's temperature. Namely, the smaller the amount of lanthanum, the higher the Curie's temperature. Here, the amount of lanthanum is preferably in such an amount that x in the formula (I) is at most 0.05. The Curie's temperature is an index for the limit of high temperature use. The limit for the high temperature use varies depending upon the particular purpose of the piezoelectric ceramic composition for actuators. Therefore, it can not necessarily be said that the higher the Curie's temperature, the better. However, it is of course preferred that the Curie's temperature is high so long as other physical properties are the same. Inversely, the physical properties of piezoelectric ceramic compositions for actuators should be compared among those showing the Curie's temperature suitable for the particular purpose.

Now, preferred embodiments of the present invention will be described.

The ceramic composition of the present invention has a high Curie's temperature, a high piezoelectric strain constant and a high mechanical quality coefficient. Particularly those having the following compositions ① to ④ in the above formula (I) have a Curie's temperature (Tc) of at least 250° C., a lateral mode piezoelectric strain constant ($d_{31}$) exceeding $100 \times 10^{-12}$ m/v and a mechanical quality coefficient (Qm) as high as at least 1,000, and thus, they are suitable as materials for high frequency operation utilizing resonance, such as a ultrasonic motor.

① $x=0.02$, $y=0.50$, $z=0.10$, $q=0.7$, the amount of $MnO_2=0.5$ wt. %, the amount of $Cr_2O_3=0.1$ wt. % (Example 1 given hereinafter)

② $x=0.03$, $y=0.50$, $z=0.10$, $q=1.0$, 0.5 or 0.0, the amount of $MnO_2=0.5$ wt. %, the amount of $Cr_2O_3=0.1$ wt. % (Examples 2, 3 and 4 given hereinafter)

③ $x=0.03$, $y=0.50$, $z=0.10$, $q=0.5$, the amount of $MnO_2=0.5$ wt. %, the amount of $Cr_2O_3=0.3$ wt. % (Example 5 given hereinafter)

④ $x=0.04$, $y=0.52$, $z=0.10$, $q=0.7$, the amount of $MnO_2=0.5$ wt. %, the amount of $Cr_2O_3=0.1$ wt. % (Example 6 given hereinafter)

Further, those having the following compositions ⑤ to ⑦ in the formula (I) have a Curie's temperature (Tc) of at least 200° C. and a lateral mode piezoelectric strain constant ($d_{31}$) exceeding $200 \times 10^{-12}$ m/v, and thus, they are particularly preferred. With a conventional composition having a lateral piezoelectric strain constant ($d_{31}$) exceeding 200 x 10-12 m/v, the dielectric loss (tan δ) is usually as large as from 2 to 3% (see Comparative Examples 5 to 7 given hereinafter). Whereas, with the products of the present invention (see Examples 9, 10 and 11 given hereinafter), the dielectric loss (tan δ) is as low as from 0.3 to 0.5%, which is from ¼ to 1/10 of the dielectric loss of the conventional products, and thus they are suitable as materials for actuators for high frequency operation.

⑤ $x=0.02$, $y=0.48$, $z=0.28$, $q=0.7$, the amount of $MnO_2=0.15$ wt. %, the amount of $Cr_2O_3=0.1$ wt. % (Example 9 given hereinafter)

⑥ $x=0.03$, $y=0.50$, $z=0.16$, $q=0.15$, the amount of $MnO_2=0.15$ wt. %, the amount of $Cr_2O_3=0.1$ wt. % (Example 10 given hereinafter)

⑦ $x=0.04$, $y=0.52$, $z=0.16$, $q=0.5$, the amount of $MnO_2=0.15$ wt. %, the amount of $Cr_2O_3=0.1$ wt. % (Example 11 given hereinafter)

If x in the formula (I) exceeds 0.07, the Curie's temperature (Tc) will be at most 150° C., whereby the upper limit of the operational temperature of the device will be at a level of from 60° to 70° C., and thus such a material is not practically useful. Besides, the lateral mode piezoelectric strain constant ($d_{31}$) is as small as not detectable by a resonance-antiresonance method, and thus it is not suitable as a material for actuators (Comparative Example 8 given hereinafter).

If z in the formula (I) is at least 0.40 (Comparative Example 1 given hereinafter), a pyrochlore phase tends to be present in a sintered body in addition to the perovskite phase, whereby the lateral mode piezoelectric constant ($d_{31}$) tends to be low, such being undesirable. Further, if the amount of $MnO_2$ exceeds 1.5% by weight, (Comparative Example 2 given hereinafter), abnormal grain growth tends to occur during the sintering, and the density of the sintered product tends to be low, and dielectric breakdown is likely to result during the polarization, such being undesirable. Accordingly, the amount of $MnO_2$ is adjusted to be at most 1.5% by weight, preferably from 0.05 to 1.2% by weight.

When $Cr_2O_3$ was not added (Comparative Example 3 given hereinafter), the lateral mode piezoelectric strain constant ($d_{31}$) and the mechanical quality coefficient (Qm) are small, and when the amount of $Cr_2O_3$ exceeds 0.5% by weight (Comparative Example 4 given hereinafter), no effect of the addition of chromium is observed in the lateral mode piezoelectric strain constant ($d_{31}$) and in the mechanical quality coefficient (Qm). This is apparent from the comparison with Examples 3 and 5 wherein the proportions of x, y, z and q and the amount of $MnO_2$ are the same. Thus, the amount of $Cr_2O_3$ should be usually at most 0.5% by weight, preferably from 0.002 to 0.5% by weight.

The ceramic composition of the present invention may be prepared, for example, by weighing oxide starting materials of the respective constituting elements to obtain a prescribed blend composition, then mixing them in a wet system by e.g. a ball mill, calcining the mixture, followed by pulverization, and sintering the obtained powder at a temperature of from 1,100° to 1,300° C.

Now, the present invention will be described in further detail with reference to Examples and Comparative Examples. However, it should be understood that the present invention is by no means restricted by such specific Examples.

EXAMPLES 1 TO 13 AND COMPARATIVE EXAMPLES 1 TO 8

PbO, $La_2O_3$, TiO, $ZrO_2$, MgO, ZnO, $Nb_2O_5$, $MnO_2$ and $Cr_2O_3$, high purity oxide starting materials having a purity of at least 99.9%, were weighed in prescribed proportions and subjected to wet-system mixing for 24 hours by means of a ball mill. The mixture was dried, molded and calcined at 900° C. for two hours. Then, it was pulverized in a mortar and again pulverized in a wet-system for 24 hours by a ball mill. The obtained powder was hydrostatically press-molded by a rubber press method and then sintered at 1,200° C. in a lead atmosphere. Then, the obtained sintered body was processed into a disk and a rod by a slicing machine. Then, an Ag paste was screen-printed and subjected to electrode baking at 550° C. Polarization treatment was conducted in a silicon oil of a temperature of from 80° to 120° C. under an electrical field intensity of from 2.0 to 4.0 kV/mm for from 5 to 20 minutes. Upon expiration of one day, various piezoelectric physical properties such as the dielectric constant at 1 kHz ($\epsilon_{33}T/\epsilon_0$), the dielectric loss at 1 kHz (tan δ), the mechanical quality coefficient (Qm), the lateral mode electromechanical coupling coefficient ($K_{31}$) and the lateral mode piezoelectric strain constant ($d_{31}$), were measured by a resonance-antiresonance method by means of a vector impedance analyzer. Further, the temperature characteristic of the relative permittivity was measured, and from the maximum of the relative permittivity, the Curie's temperature (Tc) was obtained. The results are shown in Tables 1 to 3.

TABLE 1

| Examples | Composition of the main component of the formula (I) | | | | Amount of $MnO_2$ (wt %) | Amount of $Cr_2O_3$ (wt %) | Density of sintered product (g/m²) | $\epsilon_{33}T/\epsilon_0$ | tan δ | Qm | $K_{31}$ | $d_{31}$ (×10⁻¹² m/v) | Tc (°C.) |
|---|---|---|---|---|---|---|---|---|---|---|---|---|---|
| | x | y | z | q | | | | | | | | | |
| 1 | 0.02 | 0.50 | 0.10 | 0.7 | 0.50 | 0.10 | 7.81 | 1520 | 0.004 | 1300 | 0.297 | 123 | 307 |
| 2 | 0.03 | 0.50 | 0.10 | 1.0 | 0.50 | 0.10 | 7.83 | 1450 | 0.004 | 1500 | 0.340 | 134 | 288 |
| 3 | 0.03 | 0.50 | 0.10 | 0.5 | 0.50 | 0.10 | 7.82 | 1510 | 0.003 | 1600 | 0.352 | 145 | 291 |
| 4 | 0.03 | 0.50 | 0.10 | 0.0 | 0.50 | 0.10 | 7.81 | 1480 | 0.003 | 1500 | 0.345 | 140 | 293 |
| 5 | 0.03 | 0.50 | 0.10 | 0.5 | 0.50 | 0.30 | 7.83 | 1430 | 0.003 | 1450 | 0.337 | 131 | 293 |
| 6 | 0.04 | 0.52 | 0.10 | 0.7 | 0.50 | 0.10 | 7.81 | 1380 | 0.003 | 1900 | 0.382 | 145 | 255 |
| 7 | 0.06 | 0.57 | 0.10 | 0.7 | 0.50 | 0.10 | 7.78 | 1470 | 0.003 | 1250 | 0.358 | 136 | 185 |
| 8 | 0.06 | 0.57 | 0.10 | 0.7 | 1.00 | 0.10 | 7.74 | 965 | 0.003 | 1600 | 0.290 | 88 | 188 |

TABLE 2

| Examples | Composition of the main component of the formula (I) | | | | Amount of $MnO_2$ (wt %) | Amount of $Cr_2O_3$ (wt %) | Density of sintered product (g/m²) | $\epsilon_{33}T/\epsilon_0$ | tan δ | Qm | $K_{31}$ | $d_{31}$ (×10⁻¹² m/v) | Tc (°C.) |
|---|---|---|---|---|---|---|---|---|---|---|---|---|---|
| | x | y | z | q | | | | | | | | | |
| 9 | 0.02 | 0.48 | 0.28 | 0.7 | 0.15 | 0.10 | 7.81 | 3030 | 0.005 | 220 | 0.408 | 254 | 236 |
| 10 | 0.03 | 0.50 | 0.16 | 0.5 | 0.15 | 0.10 | 7.82 | 2770 | 0.003 | 190 | 0.400 | 240 | 255 |
| 11 | 0.04 | 0.52 | 0.16 | 0.5 | 0.15 | 0.10 | 7.83 | 3250 | 0.003 | 200 | 0.417 | 273 | 227 |
| 12 | 0.06 | 0.57 | 0.10 | 0.7 | 0.20 | 0.10 | 7.78 | 3100 | 0.002 | 450 | 0.398 | 238 | 180 |
| 13 | 0.07 | 0.59 | 0.06 | 0.7 | 0.15 | 0.10 | 7.76 | 4290 | 0.006 | 160 | 0.358 | 264 | 180 |

TABLE 3

| Comparative Examples | Composition of the main component of the formula (I) | | | | Amount of $MnO_2$ (wt %) | Amount of $Cr_2O_3$ (wt %) | Density of sintered product (g/m²) | $\epsilon_{33}T/\epsilon_0$ | tan δ | Qm | $K_{31}$ | $d_{31}$ (×10⁻¹² m/v) | Tc (°C.) |
|---|---|---|---|---|---|---|---|---|---|---|---|---|---|
| | x | y | z | q | | | | | | | | | |
| 1 | 0.02 | 0.50 | 0.45 | 0.7 | 0.50 | 0.10 | 7.79 | Not measured since a pyrochlore phase coexisted | | | | | |
| 2 | 0.06 | 0.57 | 0.10 | 0.7 | 1.80 | 0.20 | 7.29 | Not measured since a dielectric breakdown took place | | | | | |
| 3 | 0.03 | 0.50 | 0.10 | 0.5 | 0.50 | 0.0 | 7.83 | 1400 | 0.003 | 1350 | 0.332 | 125 | 290 |
| 4 | 0.03 | 0.50 | 0.10 | 0.5 | 0.50 | 0.60 | 7.83 | 1390 | 0.003 | 1300 | 0.330 | 124 | 294 |
| 5 | 0.04 | 0.56 | 0 | 0 | 0.0 | 0.0 | 7.71 | 1669 | 0.022 | 68 | 0.394 | 182 | 282 |
| 6 | 0.06 | 0.58 | 0 | 0 | 0.0 | 0.0 | 7.70 | 3620 | 0.025 | 51 | 0.419 | 291 | 218 |
| 7 | 0.07 | 0.60 | 0 | 0 | 0.0 | 0.0 | 7.75 | 4305 | 0.027 | 48 | 0.361 | 273 | 172 |
| 8 | 0.08 | 0.62 | 0.02 | 0.5 | 0.10 | 0.10 | 7.76 | No resonance peak formed | | | | | 121 |

As described in the foregoing, the piezoelectric ceramic composition for actuators according to the present invention has a high electromechanical coupling coefficient, a high piezoelectric strain constant, a low dielectric constant, a low dielectric loss, a high mechanical quality coefficient and a high Curie's temperature simultaneously, and it can be used effectively as various piezoelectric materials. Particularly, the piezoelectric ceramic composition for actuators according to the present invention shows excellent properties as a material for piezoelectric actuators to be operated at a high frequency of a few kHz to hundred kHz, and it is very useful for industrial applications.

We claim:

1. A piezoelectric ceramic composition for actuators, composed of lead, lanthanum, zirconium, titanium, magnesium, zinc, niobium, manganese, chromium and oxygen atoms, which contains manganese in an amount of at most 1.5% by weight as calculated as MnO and chromium in an amount of at most 0.5% by weight as calculated as $Cr_2O_3$, relative to a main component composition of the formula (I):

$$Pb_{(1-x)}La_x[(1-z)(Zr_yTi_{(1-y)}) + z\{Mg_qZn_{(1-q)}\}_{\frac{1}{3}}Nb_{\frac{2}{3}}\}]_{(1-x/4)}O_3 \quad (I)$$

wherein $0 < x \leq 0.07$, $0.40 \leq y \leq 0.65$, $0 \leq q \leq 1$, and $0 < z \leq 0.40$.

2. The piezoelectric ceramic composition for actuators according to claim 1, wherein manganese is contained in an amount of at least 0.3% by weight as calculated as $MnO_2$.

3. The piezoelectric ceramic composition for actuators according to claim 2, wherein manganese is contained in an amount of from 0.4 to 1.2% by weight as calculated as $MnO_2$.

4. The piezoelectric ceramic composition for actuators according to claim 2, wherein chromium is contained in an amount of at least 0.002% by weight as calculated as $Cr_2O_3$.

5. The piezoelectric ceramic composition for actuators according to claim 2, wherein x in the formula (I) is at most 0.05.

6. The piezoelectric ceramic composition for actuators according to claim 1, wherein manganese is contained in an amount of less than 0.3% by weight as calculated as $MnO_2$.

7. The piezoelectric ceramic composition for actuators according to claim 6, wherein manganese is contained in an amount of from 0.05 to 0.25% by weight as calculated as $MnO_2$.

8. The piezoelectric ceramic composition for actuators according to claim 6, wherein chromium is contained in an amount of at least 0.002% by weight as calculated as $Cr_2O_3$.

9. The piezoelectric ceramic composition for actuators, according to claim 6, wherein x in the formula (I) is at most 0.05.

* * * * *